(12) United States Patent
Machita et al.

(10) Patent No.: US 7,911,744 B2
(45) Date of Patent: Mar. 22, 2011

(54) MAGNETO-RESISTIVE EFFECT DEVICE AND MAGNETIC DISK SYSTEM WITH REFILLED INSULATION LAYER IN CONTACT WITH A READ END FACE OF A CAP LAYER

(75) Inventors: Takahiko Machita, Tokyo (JP); Daisuke Miyauchi, Tokyo (JP)

(73) Assignee: TDK Corporation, Tokyo (JP)

( * ) Notice: Subject to any disclaimer, the term of this patent is extended or adjusted under 35 U.S.C. 154(b) by 938 days.

(21) Appl. No.: 11/768,625

(22) Filed: Jun. 26, 2007

(65) Prior Publication Data

US 2009/0002897 A1    Jan. 1, 2009

(51) Int. Cl.
*G11B 5/39* (2006.01)
(52) U.S. Cl. .................................. 360/320; 360/324.1
(58) Field of Classification Search .............. 360/324.1, 360/320, 324, 313
See application file for complete search history.

(56) References Cited

U.S. PATENT DOCUMENTS

| | | | |
|---|---|---|---|
| 7,580,230 B2 * | 8/2009 | Freitag et al. | 360/324.12 |
| 7,652,856 B2 * | 1/2010 | Pinarbasi | 360/324.11 |
| 2006/0067010 A1 * | 3/2006 | Kagami et al. | 360/324.1 |
| 2007/0127165 A1 | 6/2007 | Kanaya et al. | 360/324.1 |
| 2009/0086385 A1 * | 4/2009 | Gill et al. | 360/324.11 |
| 2009/0316308 A1 * | 12/2009 | Saito et al. | 360/324.1 |

FOREIGN PATENT DOCUMENTS

| | | |
|---|---|---|
| JP | 2004-118978 | 4/2004 |
| JP | 2004-206839 | 7/2004 |
| JP | 2006-49539 | 2/2006 |
| JP | 2007-157221 | 6/2007 |

* cited by examiner

*Primary Examiner* — Julie Anne Watko
(74) *Attorney, Agent, or Firm* — Oblon, Spivak, McClelland, Maier & Neustadt, L.L.P.

(57) ABSTRACT

The invention provides a giant magneto-resistive effect device (CPP-GMR device) having a CPP (current perpendicular to plane) structure comprising a multilayer device assembly comprising a fixed magnetization layer, a spacer layer, a free layer and a cap layer stacked one upon another in order, with a sense current applied in a stacking direction of the multilayer device assembly. In the rear of the multilayer device assembly, there is a refilled insulation layer formed, which is in contact with the rear end face of the multilayer device assembly and extends rearward, wherein the uppermost position P of the refilled insulation layer that is in contact with the rear end face of said multilayer device assembly lies at a rear end face of the cap layer and is set in such a way as to satisfy a relation: $0.2 \leq (T2/T1) < 1$ where T1 is the thickness of the cap layer, and T2 is the absolute value of a distance from the uppermost portion of the cap layer down to the position P as viewed in a thickness direction. Thus, the invention can provide a CPP-GMR device with which further improvements in the MR change ratio at an area of low area resistivity AR are brought about and resistance to magnetic field is enhanced with high reliability as well, so that the coming-generation head having such a recording density as exceeds 400 Gbpsi could be practically achieved.

9 Claims, 7 Drawing Sheets

MAGNETO-RESISTIVE EFFECT DEVICE AND MAGNETIC DISK SYSTEM WITH REFILLED INSULATION LAYER IN CONTACT WITH A READ END FACE OF A CAP LAYER

BACKGROUND OF THE INVENTION

1. Field of the Invention

The present invention relates to a CPP-GMR device for reading the magnetic field strength of a magnetic recording medium or the like as signals, a thin-film magnetic head comprising that CPP-GMR device, and a head gimbal assembly and a magnetic disk system comprising that thin-film magnetic head.

2. Explanation of the Prior Art

As the density of hard disks (HDDs) increases, there are growing demands for improvements in the performance of thin-film magnetic heads. For the thin-film magnetic head, a composite type thin-film magnetic head has been widely used, which has a structure wherein a reproducing head having a read-only magneto-resistive effect device (MR device) and a recording head having a write-only induction type magnetic device are stacked together.

A magneto-resistive effect device of the type that operates on currents flowing parallel with the device plane—called the spin valve GMR device—is now widely used as the reproducing head. The spin valve GMR device is located between upper and lower shield layers, each formed of a soft magnetic metal material, via an insulating layer called a gap layer. The recording density of the device in the bit direction is determined by the spacing between the upper and the lower shield layer (reproducing gap spacing).

With recent increases in the recording density, there are rising demands for the reproducing head to have a narrower shield gap or track. A decreasing track width gives rise to a device height decrease, resulting in a device area decrease. A problem with the prior art structure is that a worsening of heat radiation efficiency due to the device area decrease places some limits on operating currents in view of reliability. To solve that problem, there has been a head structure proposed, wherein the first and the second shield film are connected electrically in series with the magneto-resistive effect device to dispense with any inter-shield insulating layer. Called the current-perpendicular-to-plane (CPP) structure, such structure is considered essential to achieve a recording density exceeding 200 Gbits/in².

The general arrangement of the "spin valve type" CPP-GMR device here is briefly described. Part of the spin valve type CPP-GMR device has a multilayer structure comprising a ferromagnetic film (1) and a ferromagnetic film (2) separated off by an electroconductive, nonmagnetic intermediate layer. Referring specifically to the structure of part of a typical spin valve type CPP-GMR device, it has a multilayer structure comprising a lower electrode/antiferromagnetic film/ferromagnetic film (1)/nonmagnetic intermediate layer/ferromagnetic film (2)/upper electrode stacked together in order. In such a multilayer structure, the uppermost layer defines the upper electrode and the lowermost layer defines the lower electrode. When the magnetic field applied from outside is zero, the direction of magnetization of the ferro-magnetic film (1) that is one of the ferromagnetic films is fixed in the perpendicular direction to that of the ferromagnetic film (2).

The direction of magnetization of the ferromagnetic film (1) is fixed by providing the antiferromagnetic film adjacent to the ferromagnetic film (1) so that uni-directional anisotropic energy (or also called an exchange bias or a coupling magnetic field) is imparted to the ferromagnetic film (1) by way of exchange coupling. For this reason, the ferromagnetic film (1) is usually called a fixed magnetization (pinned) layer.

In such a CPP-GMR device, the smaller the sectional area of the device, the larger the resistance value grows, and the more the amount of resistance change becomes as well. In other words, that device has the feature of being fit for making track width narrower. Even with a decreasing device size, however, the resistance value of the device remains very low whenever it is made of an ordinary metal material alone. Diverse methods have thus been figured out to increase the amount of resistance change. As one typical method, a current-narrowing type CPP-GMR device has been proposed in the art (for instance, JP(A)'s 2002-208744 and 2006-54257). This CPP-GMR device structure has the feature of comprising an insulating layer interposed between the aforesaid ferromagnetic film (1) and the aforesaid ferromagnetic film (2) and a nonmagnetic intermediate layer including a current path extending through the insulating layer. The material of the nonmagnetic intermediate layer forming the current path extending through the aforesaid insulating layer contains at least one element selected from the group consisting of Cu, Au, and Ag. The use of such a current-narrowing effect makes it possible to reduce the proportion of parasitic resistance (for instance, the resistance of the aforesaid antiferromagnetic film) occurring for the reason of low resistance that is the feature and advantage of the CPP-GMR device by controlling the flow of sense currents. It is thus possible to decrease the proportion of parasitic resistance that does not essentially contribute to resistance changes, thereby improving the MR change ratio.

At an area of the current-narrowing CPP-GMR device having a low area resistivity (AR), for instance, at an area of AR=0.2 to 0.3Ω·μm2, however, the MR change ratio remains as low as 4 to 5%, a figure still inadequate for a possible practical head having a recording density exceeding 400 Gbpsi, and so further improvements in the MR change ratio are still in strong demand.

The situations being like such, an object of the present invention is to provide a CPP-GMR device with which further improvements in the MR change ratio at an area of low area resistivity AR are brought about and resistance to magnetic field is enhanced with high reliability as well, so that the coming-generation head having such a recording density as exceeds 400 Gbpsi could be practically achieved.

SUMMARY OF THE INVENTION

According to the invention, the aforesaid object is accomplishable by the provision of a giant magneto-resistive effect device (CPP-GMR device) having a CPP (current perpendicular to plane) structure comprising a multilayer device assembly comprising a fixed magnetization layer, a spacer layer, a free layer and a cap layer stacked together in order, with a sense current applied in a stacking direction of said multilayer device assembly, wherein, in the rear of said multilayer device assembly, there is a refilled insulation layer formed, which is in contact with the rear end face of said multilayer device assembly and extends rearward, wherein: the uppermost position P of said refilled insulation layer that is in contact with the rear end face of said multilayer device assembly lies at a rear end face of the cap layer and is set in such a way as to satisfy a relation: $0.2 \leq (T2/T1) < 1$ where T1 is the thickness of the cap layer, and T2 is the absolute value of a distance from the uppermost portion of the cap layer down to the position P as viewed in a thickness direction.

In a more preferable embodiment of the invention, the uppermost position P of said refilled insulation layer that is in contact with the rear end face of said multilayer device assembly is set in such a way as to satisfy a relation: $0.2 \leq (T2/T1) \leq 0.9$.

In a more preferable embodiment of the invention, the uppermost position P of said refilled insulation layer that is in contact with the rear end face of said multilayer device assembly is set in such a way as to satisfy a relation: $0.4 \leq (T2/T1) \leq 0.9$.

In a more preferable embodiment of the invention, said cap layer is made of at least one selected from the group consisting of Ta, Ru, Ti, W, Cr, Rh, and NiCr.

In a more preferable embodiment of the invention, said multilayer device assembly has an area resistivity of 0.05 to $0.3\Omega \cdot \mu m2$.

In a more preferable embodiment of the invention, said free layer functions such that its magnetization direction changes depending on an external magnetic field, and said fixed magnetization layer has a magnetization direction fixed.

The present invention also provides a thin-film magnetic head, comprising a medium opposite plane opposite to a recoding medium, the aforesaid CPP-GMR device located near said medium opposite plane for detecting a signal magnetic field from said recording medium, and a pair of electrodes for passing a current in the stacking direction of said magneto-resistive effect device.

Further, the present invention provides a head gimbal assembly, comprising a slider including the aforesaid thin-film magnetic head and located in opposition to a recording medium, and a suspension adapted to resiliently support said slider.

Still further, the present invention provides a magnetic disk system, comprising a slider including the aforesaid thin-film magnetic head and located in opposition to a recording medium, and a positioning means adapted to support and position said slider with respect to said recording medium.

DETAILED EXPLANATION OF THE INVENTION

The best mode for carrying out the invention is now explained in details.

Figure 1:
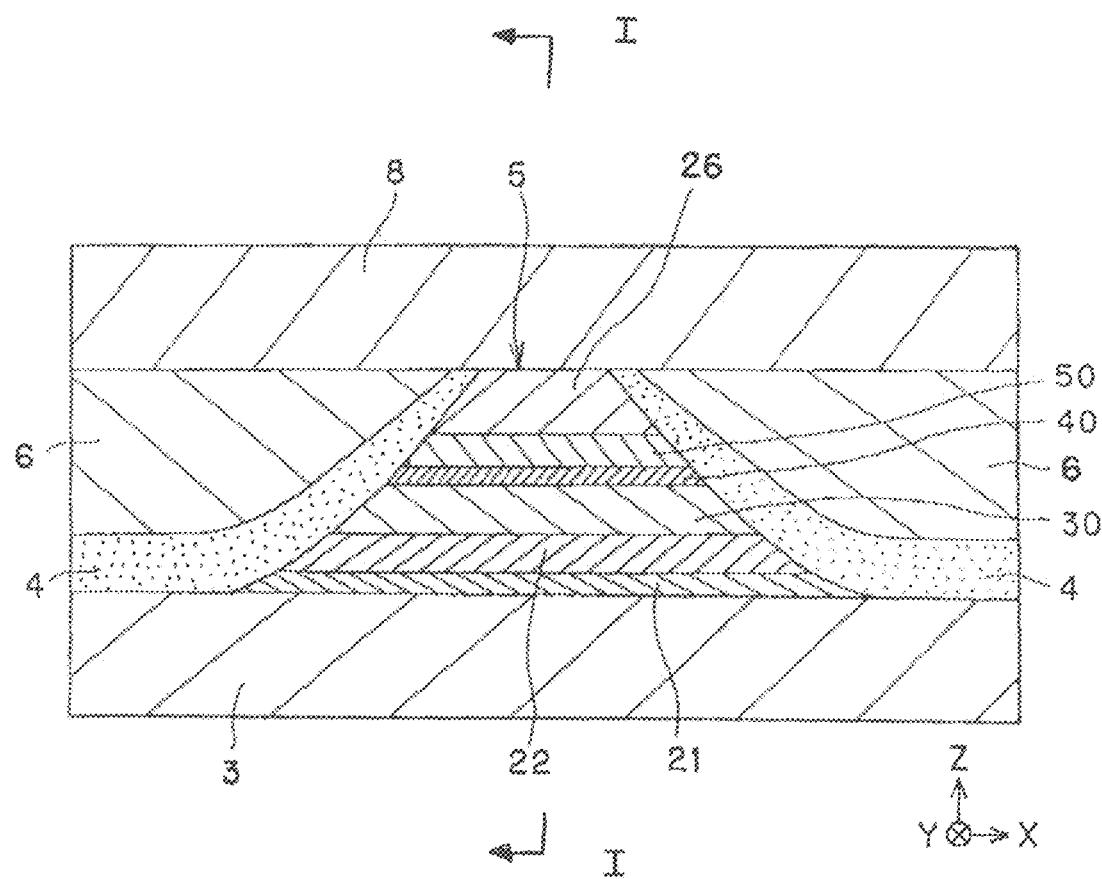
FIG. 1 is a sectional view illustrative of a section of the reproducing head primarily parallel with the medium opposite plane in an embodiment of the invention.

FIG. 1 is illustrative of the ABS (air bearing surface) of a reproducing head in an embodiment of the invention; it is illustrative in schematic of the ABS of the giant magneto-resistive effect device (CPP-GMR device) having a CPP structure—part of the invention in particular. An ABS is generally corresponding to a plane (hereinafter often called the medium opposite plane) at which a reproducing head is in opposition to a recording medium; however, it is understood that the ABS here includes even a section at a position where the multilayer structure of the device can be clearly observed. For instance, a protective layer such as DLC (the protective layer adapted to cover the device), in a strict sense, positioned at the medium opposite plane may be factored out, if necessary.

Figure 2:
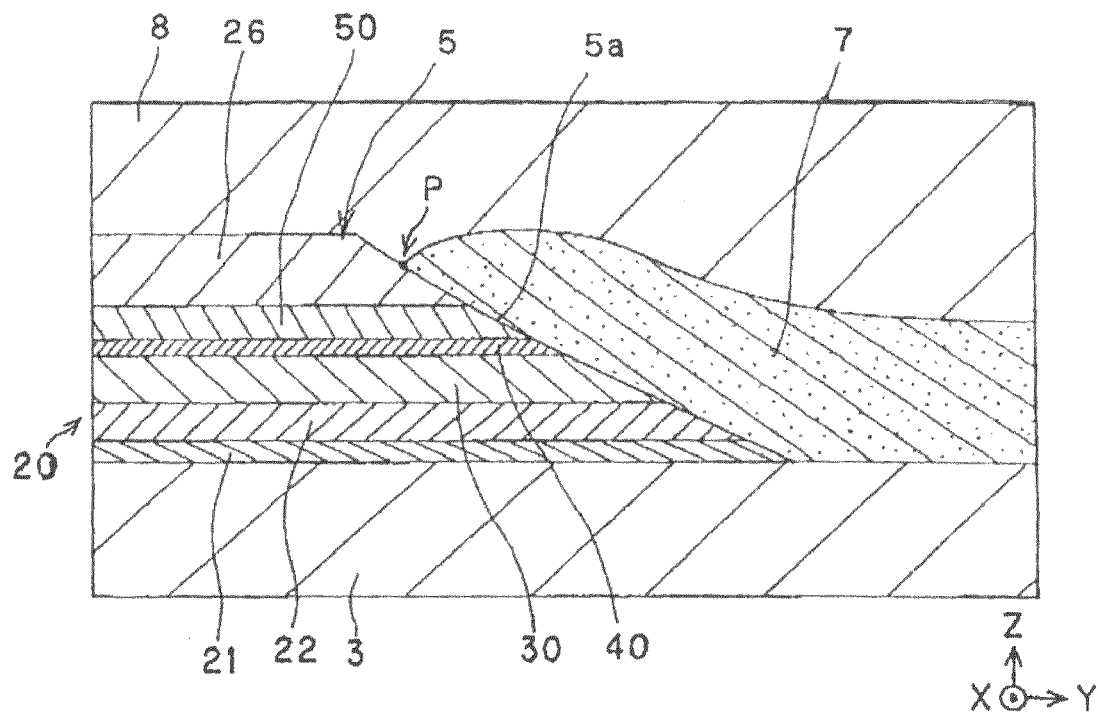
FIG. 2 is a sectional view as taken on arrows I-I in FIG. 1; it is a sectional view illustrative of a section of the reproducing head primarily perpendicular to the medium opposite plane in an embodiment of the invention.

FIG. 2 is a sectional view as taken on arrows I-I in FIG. 1; it is a sectional view illustrative of a section of the reproducing head primarily perpendicular to the medium opposite plane in an embodiment of the invention.

Figure 3:
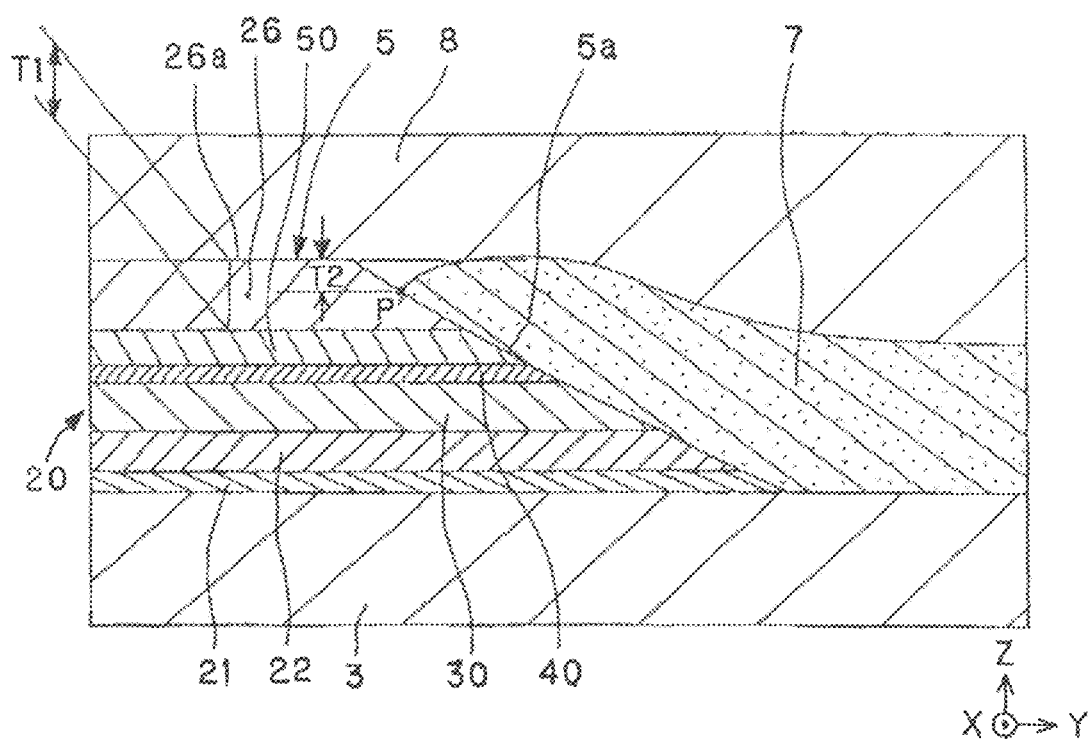
FIG. 3 is illustrative, substantially as in FIG. 2, of a section of part of the invention in particular.

FIG. 3 is illustrative, as substantially in FIG. 2, of a section of part of the invention in particular.

Figure 4:
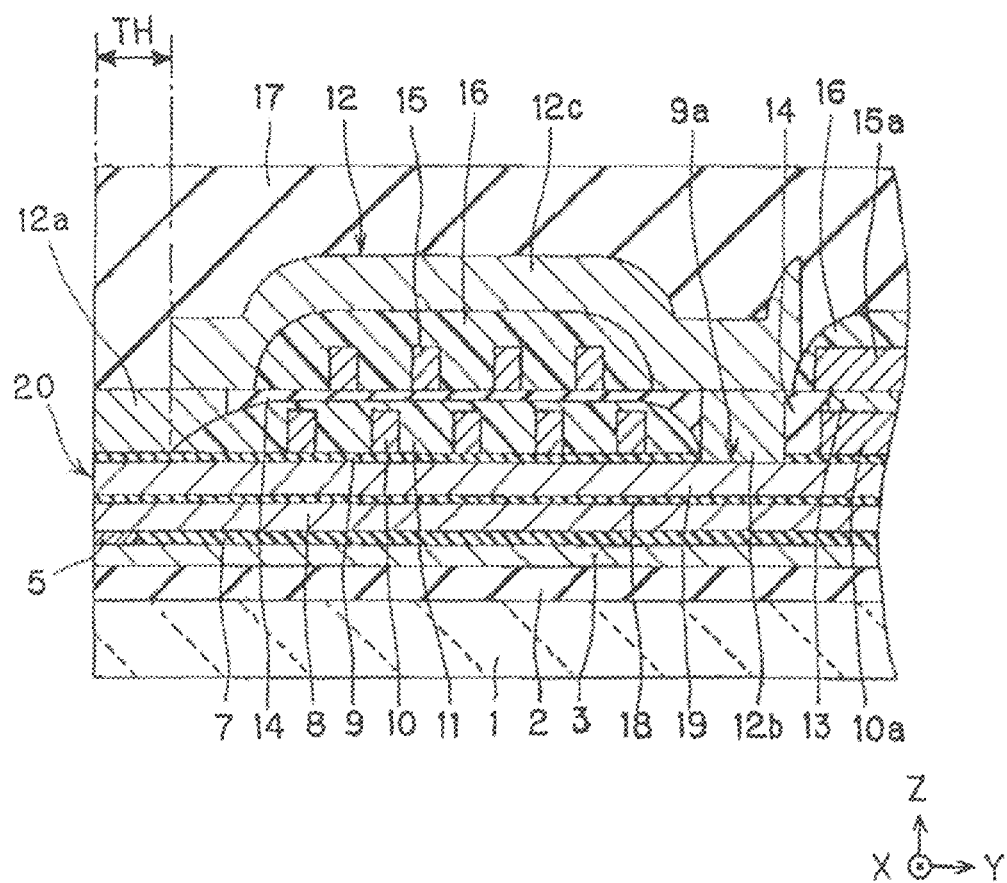
FIG. 4 is illustrative of the construction of the thin-film magnetic head according to one preferable embodiment of the invention; it is a sectional view illustrative of a section of the thin-film magnetic head perpendicular to the medium opposite plane and the substrate.

FIG. 4 is illustrative of the construction of the thin-film magnetic head according to one preferable embodiment of the invention; it is a sectional view illustrative of a section of the thin-film magnetic head perpendicular to the ABS and the substrate.

Figure 5:
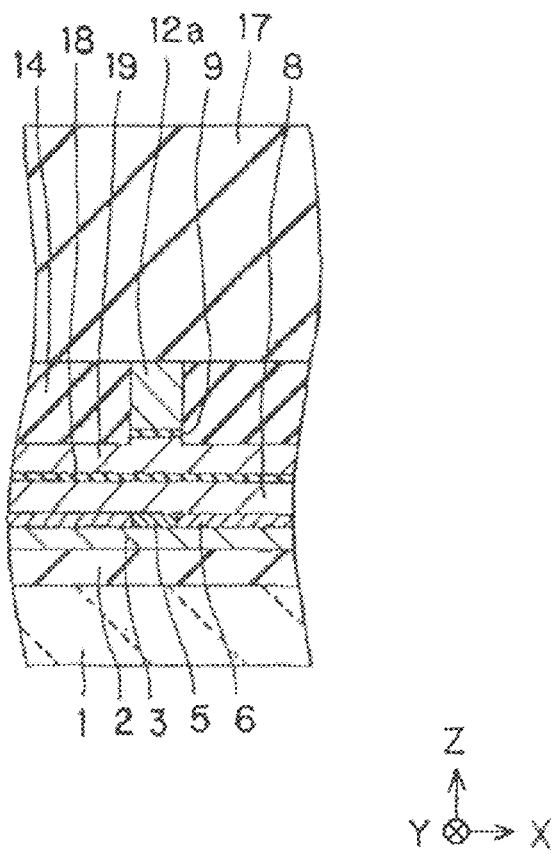
FIG. 5 is illustrative of the construction of the thin-film magnetic head according to one preferable embodiment of the invention; it is illustrative of a section of the magnetic pole portion of the thin-film magnetic head parallel with the medium opposite plane.

FIG. 5 is illustrative of the construction of the thin-film magnetic head according to one preferable embodiment of the invention; it is a sectional view illustrative of a section of the thin-film magnetic head parallel with the ABS and the substrate.

Figure 6:
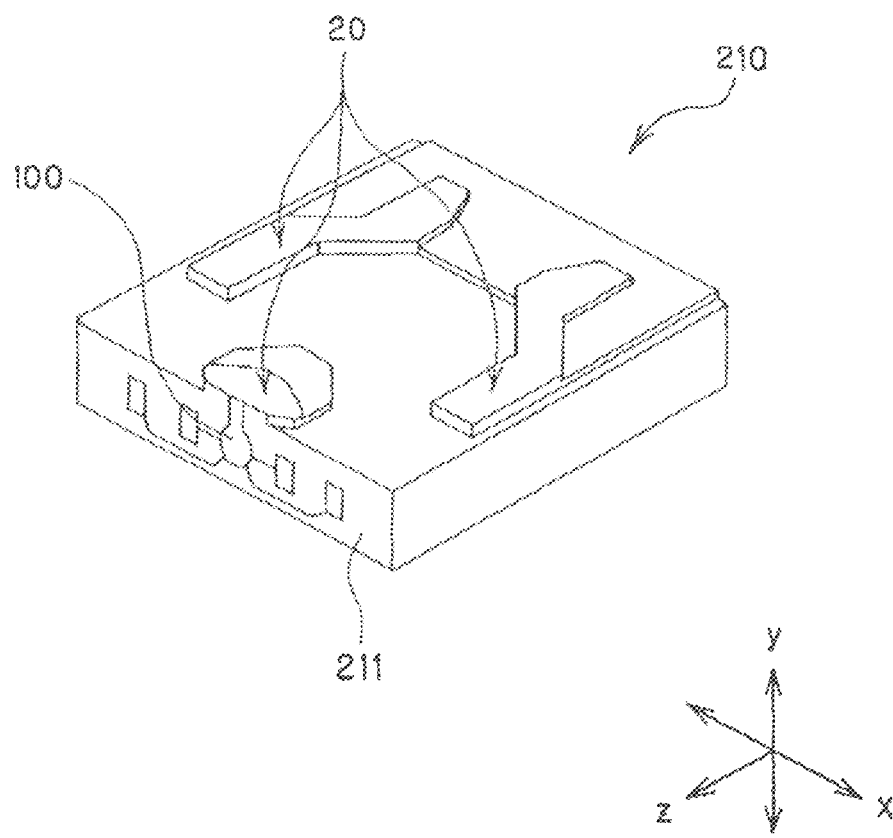
FIG. 6 is a perspective view of a slider built in the head gimbal assembly according to one embodiment of the invention.
Figure 7:
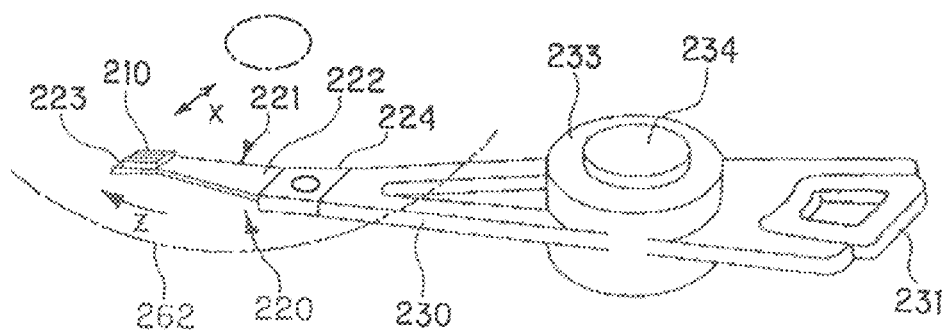
FIG. 7 is a perspective view of a head arm assembly including the head gimbal assembly according to one embodiment of the invention.
Figure 8:
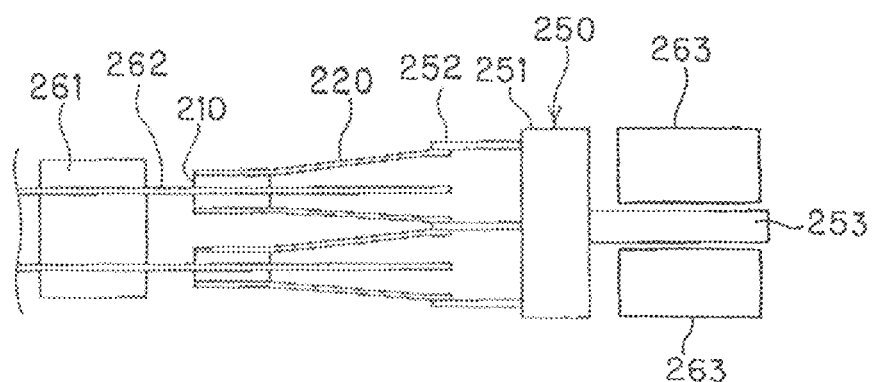
FIG. 8 is illustrative of part of the magnetic disk system according to one embodiment of the invention.
Figure 9:
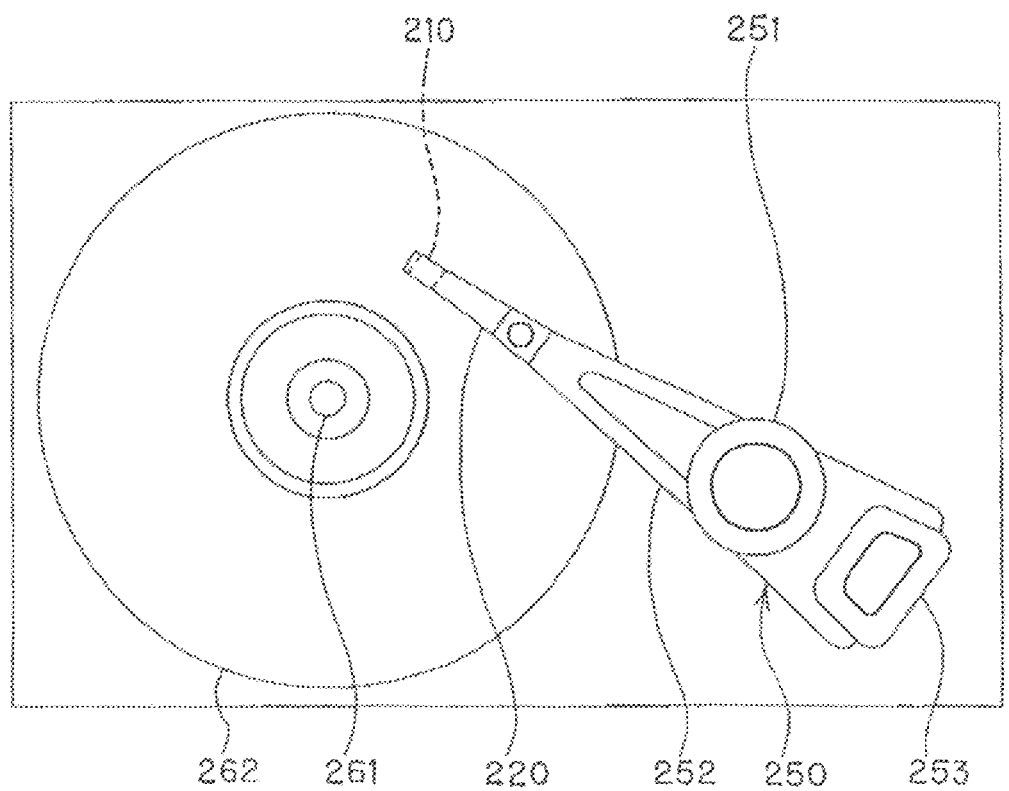
FIG. 9 is a plan view of the magnetic disk system according to one embodiment of the invention.

FIG. 6 is a perspective view of a slider built in the head gimbal assembly according to one embodiment of the invention; FIG. 7 is a perspective view of a head arm assembly including the head gimbal assembly according to one embodiment of the invention; FIG. 8 is illustrative of part of the magnetic disk system according to one embodiment of the invention; and FIG. 9 is a plan view of the magnetic disk system according to one embodiment of the invention.

In the following disclosure of the invention, the sizes of each device component in the X-, Y- and Z-axis directions shown in the drawings inclusive of FIGS. 1-6 will be referred to as the "width", "length" and "thickness", respectively. The side of the device nearer to the air bearing surface (the plane of the thin-film magnetic head in opposition to the recording medium) in the Y-axis direction will be called "forward" and the opposite side (depth side) will be called "rearward", and the direction of stacking the individual films up will be called "upward" or "upper side" and the opposite direction will be called "downward" or "lower side".

[Giant Magneto-Resistive Effect Device (CPP-GMR Device) Having a CPP Structure]

The construction of a reproducing head comprising the inventive giant magneto-resistive effect device (CPP-GMR device) having a CPP structure is now explained in details with reference to FIG. 1.

As noted above, FIG. 1 is a sectional view corresponding to a section of the reproducing head parallel with the medium opposite plane.

As shown in FIG. 1, the reproducing head according to the embodiment here comprises a first shield layer 3 and a second shield layer 8 that are located at a given space and opposed vertically on the sheet, a giant magneto-resistive effect device assembly 5 (hereinafter referred to as the "GMR device assembly 5" or the "multilayer device assembly 5") interleaved between the first shield layer 3 and the second shield layer 8, an insulating film 4 adapted to cover two sides of the GMR device assembly 5 and a part of the upper surface of the first shield layer 3 along these sides, and two bias magnetic field-applying layers 6 adjacent to the two sides of the GMR device assembly 5 via the insulating layer 4.

In the embodiment here, the first 3 and the second shield layer 8 take a so-called magnetic shield role plus a pair-of-electrodes role. In other words, they have not only a function of shielding magnetism but also function as a pair of electrodes adapted to pass a sense current through the GMR device in a direction intersecting the plane of each of the layers forming the GMR device assembly 5, for instance, in a direction perpendicular to the plane of each of the layers forming the GMR device (stacking direction).

Apart from the first 3 and the second shield layer 8, another pair of electrodes may be additionally provided above and below the GMR device.

The reproducing head of the invention includes the GMR device assembly 5 having a CPP structure.

Referring to the inventive GMR device assembly 5 having a CPP structure in terms of a broad, easy-to-understand concept, it comprises a spacer layer 40, and a fixed magnetization layer 30 and a free layer 50 that are stacked one upon another with the spacer layer 40 held between them, and a cap layer 26 on the free layer 50, as shown in FIG. 1. And then, a sense current is applied to the GMR device assembly 5 in its stacking direction to enable its function. In short, there is the GMR device having a CPP (current perpendicular to plane) structure involved.

The free layer 50 has its magnetization direction changing dependent on an external magnetic field, viz., a signal magnetic field from a recording medium, while the fixed magnetization layer 30 has its magnetization direction fixed under the action of an antiferromagnetic layer 22.

(Explanation of the Fixed Magnetization Layer 30)

In the invention, the fixed magnetization layer 30 is formed on the antiferromagnetic layer 22 having a pinning action via an underlay layer 21 formed on the first shield layer 3.

Although illustrated just like one single layer, yet it is preferable that the fixed magnetization layer 30 has a so-called synthetic pinned layer comprising three layers. That is, it comprises, in order from the side of the anti-ferromagnetic layer 22, an outer layer, a nonmagnetic intermediate layer and an inner layer, all stacked together in order.

The outer and the inner layer are each provided by a ferromagnetic layer made of, for instance, a ferro-magnetic material containing Co, and Fe. The outer and the inner layers are antiferromagnetically coupled and fixed such that their magnetization directions are opposite to each other.

The outer, and the inner layer is preferably made of, for instance, a $Co_{65-70}Fe$ (atomic %) alloy. The outer layer has a thickness of preferably about 3 to 7 nm, and the inner layer has a thickness of preferably about 3 to 10 nm. The inner layer may also contain a Heusler alloy layer.

For instance, the nonmagnetic intermediate layer is made of a nonmagnetic material containing at least one selected from the group consisting of Ru, Rh, Ir, Re, Cr, Zr and Cu, and has a thickness of, for instance, about 0.35 to 1.0 nm. The nonmagnetic intermediate layer is provided to fix the magnetization of the inner layer and the magnetization of the outer layer in mutually opposite directions. The phrase "magnetization in mutually opposite directions" stands for a broad concept that encompasses just only two such magnetizations in just opposite directions of 180° but also those in different directions of 180°±20° as well.

(Explanation of the Free Layer 50)

The free layer 50 has its magnetization direction changing depending on an external magnetic field, i.e., a signal magnetic field from the recording medium, and is made of a ferromagnetic layer (soft magnetic layer) having a small coercive force. The free layer 50 has a thickness of, for instance, about 2 to 10 nm, and may be in either a single layer form or a multilayer form including a plurality of ferromagnetic layers. The free layer 50 may also contain a Heusler alloy layer.

(Explanation of the Cap Layer 26)

As shown in FIG. 1, there is a cap (protective) layer 26 formed on the free layer 50. The cap layer 26 has primarily two functions: one of protecting a multilayer formed below the cap layer, and another of setting the thickness of the cap layer 26 thereby adjusting the free layer 50—part of the sensing function—in such a way as to be positioned on about the middle of the device film with the free layer 50 stacked on it.

The cap layer 26 is made of at least one material selected from the group consisting of Ta, Ru, Ti, W, Cr, Rh, NiCr, etc., among which preference is given to Ta, Ru, Ti, and NiCr, and has a thickness of about 0.5 to 20 nm.

(Explanation of the Spacer Layer 40)

In the invention, the spacer layer 40 is made of a nonmagnetic, electroconductive layer; more specifically, a material such as Cu, Ag, Au, Ru, and Rh is used for it.

The spacer layer 40 may have not only a single layer structure but also a three-layer structure comprising a first nonmagnetic metal layer and a second nonmagnetic metal layer with a semiconductor oxide layer interleaved between them.

The spacer layer 40 has a thickness of about 1 to 4 nm.

(Explanation of the Antiferromagnetic Layer 22)

The antiferromagnetic layer 22 works such that by way of exchange coupling with the fixed magnetization layer 30 as described above, the magnetization direction of the fixed magnetization layer 30 is fixed.

For instance, the antiferromagnetic layer 22 is made of an antiferromagnetic material containing at least one element M' selected from the group of Pt, Ru, Rh, Pd, Ni, Cu, Ir, Cr and Fe, and Mn. The content of Mn is preferably 35 to 95 at %. The antiferromagnetic material is broken down into two types: (1) a non-heat treatment type antiferromagnetic material that shows anti-ferromagnetism even in the absence of heat treatment to induce an exchange coupling magnetic field between it and a ferromagnetic material, and (2) a heat treatment type antiferromagnetic material that is going to show anti-ferromagnetism by heat treatment. To the anti-ferromagnetic material of the type (1), too, heat treatment is usually applied to place the direction of exchange coupling in order. In the invention, both types (1) and (2) may be used without restriction. For instance, the non-heat treatment type antiferromagnetic material is exemplified by RuRhMn, FeMn, and IrMn, and the heat treatment type antiferromagnetic material is exemplified by PtMn, NiMn, and PtRhMn.

The antiferromagnetic layer 22 has a thickness of about 4 to 15 nm.

It is here noted that for the layer for fixing the magnetization direction of the fixed magnetization layer 30, it is acceptable to use a hard magnetic layer comprising a hard magnetic material such as CoPt in place of the aforesaid antiferromagnetic layer.

The underlay layer 21 formed below the anti-ferromagnetic layer 22 is provided to improve the crystallization and orientation of each of the layers stacked on it in general, and the exchange coupling of the antiferromagnetic layer 22 and the fixed magnetization layer 30 in particular. For such underlay layer 21, for instance, a multilayer of Ta and NiCr layers or Ta and Ru layers is used. The underlay layer 21 has a thickness of about 2 to 6 nm as an example.

The area resistivity, AR, of the GMR device assembly 5 here is in the range of 0.05 to $0.3\Omega \cdot m^2$, preferably 0.07 to $0.3\Omega \cdot \mu m^2$, and more preferably 0.1 to $0.28\Omega \cdot \mu m^2$. Any deviation from the range of 0.05 to $0.3\Omega \cdot \mu m^2$ would make it difficult to obtain large MR ratios while reducing noises and staving off the influences of spin torque. Further, if the essential structure of the invention of this application is applied to a device having such low resistance, it is then possible to reduce parasitic resistance, thereby improving MR change ratios.

The portion of the device (CPP-GMR device) to be measured for its area resistivity is a multilayer arrangement comprising the underlay layer 21, anti-ferromagnetic layer 22, fixed magnetization layer 30, spacer layer 40, free layer 50 and cap layer 26, as shown in FIG. 1. In the present disclosure, the multilayer film having the fixed magnetization layer 30, spacer layer 40, free layer 50 and cap layer 26 stacked together in order is called the "multilayer device assembly" or "GMR device assembly".

Referring now to the insulating layer 4 shown in FIG. 1, it is made of typically an alumina material. For the bias magnetic field-applying layer 6, for instance, use is made of a hard magnetic layer (hard magnet) or a multilayer arrangement of a ferromagnetic layer and an antiferromagnetic layer, specifically, CoPt, and CoCrPt.

(Explanation of Part of the Invention)

As shown in FIGS. 2 and 3, there is a refilled insulation layer 7 provided in the rear of the "multilayer device assembly", which is in contact with the rear end face of the multilayer device assembly and extends rearward. The formation and provision of the refilled insulation layer itself is well known in the art. However, the way of forming the refilled insulation layer according to the invention is noteworthy because it is an unheard-of way at all in the prior art and can produce quite remarkable advantages.

More specifically, as shown in FIG. 3, the uppermost position P of the refilled insulation layer 7 that comes in contact with the rear end face 5a of the multilayer device assembly 5 lies at a position in contact with the rear end face of the cap layer 26. Here, let T1 be the thickness of the cap layer 26, and T2 be the absolute value of a distance from the uppermost portion 26a (the uppermost surface 26a) of the cap layer 26 down to the position P as viewed in the thickness direction. Then, point P is set in such a way as to satisfy a relation: $0.2 \leq (T2/T1) < 1$.

The position of point P is preferably $0.2 \leq (T2/T1) \leq 0.9$, and more preferably $0.4 \leq (T2/T1) \leq 0.9$.

As the value of (T2/T1) is less than 0.2, it causes inconvenience: the incapability of making significant improvements in the MR change ratio. As the value of (T2/T1) is greater than 1, on the other hand, it causes a drastic worsening of resistance to magnetic field with a lowering of the MR change ratio.

In the embodiment shown in FIGS. 2 and 3, the rear end face 5a of the multilayer device assembly 5 that the refilled insulation 7 contacts has a smooth slope; however, the slope of the rear end face 5a may have two steps along the way.

The refilled insulation layer is made of an insulating material such as silicon dioxide.

The giant magneto-resistive effect device (CPP-GMR device) of the CPP structure in the embodiment of the invention as described above may be formed by means of vacuum film-formation techniques such as sputtering. If required, heat treatment may be applied to it after film-formation.

(Explanation of the Whole Construction of the Thin-Film Magnetic Head)

The whole construction of the thin-film magnetic head comprising the aforesaid magneto-resistive effect device is now explained.

As already mentioned, FIGS. 4 and 5 are illustrative of the construction of the thin-film magnetic head according to one preferred embodiment of the invention; FIG. 4 is illustrative of a section of the thin-film magnetic head perpendicular to the ABS and a substrate, and FIG. 5 is illustrative of a section of a magnetic pole portion of the thin-film magnetic head parallel with the ABS.

The whole structure of the thin-film magnetic head will be better understood when consideration is given to its fabrication process steps; the whole structure of the thin-film magnetic head is now explained with reference to its fabrication process steps.

First of all, an insulating layer 2 comprising an insulating material such as alumina ($Al_2O_3$) or silicon dioxide ($SiO_2$) is formed by sputtering or like techniques on a substrate 1 comprising a ceramic material such as AlTiC ($Al_2O_3$.TiC). That insulating layer has a thickness of typically about 0.5 to 20 μm.

Then, a lower shield layer 3 comprising a magnetic material and adapted for a reproducing head is formed on that insulating layer 2. The shield layer 3 has a thickness of typically about 0.1 to 5 μm. The magnetic material used for such lower shield layer 3, for instance, includes FeAlSi, NiFe, CoFe, CoFeNi, FeN, FeZrN, FeTaN, CoZrNb, and CoZrTa. The lower shield layer 3 is formed by sputtering, plating or like other techniques.

Then, a CPP-GMR device having a reproducing GMR device assembly 5 is formed on the lower shield layer 3.

Although not shown, an insulating film (that is on a par with the insulating film 4 of FIG. 4) is then formed in such a way as to cover two sides of the GMR device assembly 5 and the upper surface of the first shield layer 3. The insulating film is formed of an insulating material such as alumina.

Then, two bias magnetic field-applying layers 6 are formed in such a way as to be adjacent to the two sides of the GMR device assembly 5 via the insulating layer. Then, a refilled insulation layer 7 is formed in such a way as to be located around the GMR device assembly 5 and bias magnetic field-applying layers 6. The way of forming and positioning the refilled insulation layer 7 is part of the invention of this application, as already described; the refilled insulation layer 7 is formed and positioned such that, as shown in FIG. 3, its uppermost position P in contact with the rear end face 5a of the multilayer device assembly 5 becomes a given position of the rear end face of the cap layer 26 as determined herein.

Then, a second shield layer 8 for the reproducing head, comprising a magnetic material, is formed on the CPP-GMR device assembly 5, bias magnetic field-applying layers 6 and refilled insulation layer 7. The second shield layer 8, for instance, is formed by means of plating or sputtering.

Then, a separation layer 18 comprising an insulating material such as alumina is formed by sputtering or the like on the upper shield layer 8. Then, a lower magnetic pole layer 19, comprising a magnetic material and adapted for a recording head, is formed by plating, sputtering or the like on the separation layer 18. The magnetic material used for the second shield layer 8, and the lower magnetic pole layer 19, for instance, includes a soft magnetic material such as NiFe, CoFe, CoFeNi, and FeN. It is here noted that instead of the multilayer arrangement of the second shield layer 8, separation layer 18 and lower magnetic pole layer 19, it is acceptable to configure the second shield layer in such a way as to work also as a lower electrode layer.

Then, a recording gap layer 9 comprising a non-magnetic material such as alumina is formed by sputtering or the like on the lower magnetic pole layer 19. That recording gap layer has a thickness of about 50 to 300 nm.

For the formation of a magnetic path, the recording gap layer 9 is then partially etched at the center of the thin-film coil to be described later to form a contact hole 9a.

Then, a first layer portion 10 of the thin-film coil, typically comprising copper (Cu), is formed on the recording gap layer 9 at a thickness of typically 2 to 3 μm. In FIG. 4, note that reference numeral 10a stands for a connector portion of the first layer portion 10, which is to be connected to a second layer portion 15 of the thin-film coil to be described later. The first layer portion 10 is wound around the contact hole 9a.

Then, an insulating layer 11 comprising a photo-resist or other organic material having fluidity upon heating is formed in such a given pattern as to cover the first layer portion 10 of the thin-film coil and the surrounding recording gap layer 9.

Then, the insulating layer 11 is heat treated at a given temperature to make its surface flat. By this heat treatment, each of the edge portions of the outer and inner peripheries of the insulating layer 11 is configured into a rounded slant.

Then, in an area of the insulating layer 11 from a slant portion on the medium opposite plane 20 (to be described later) side to the medium opposite plane 20 side, a track width-setting layer 12a of an upper magnetic pole layer 12 is formed on the recording gap layer 9 and insulating layer 11, using the magnetic material for the recording head. The upper magnetic pole layer 12 is made up of that track width-setting layer 12a, and a coupler portion layer 12b and a yoke portion layer 12c to be described later.

The track width-setting layer 12a is formed on the recording gap layer 9, including an end portion that provides a magnetic pole portion of the upper magnetic pole layer 12 and a connector portion that is formed on the slant portion of the insulating layer 11 on the medium opposite plane 20 side and connected to the yoke portion layer 12c. The width of that end portion is set equal to the recording track width, and the width of the connector portion is greater than the width of the end portion.

Simultaneously with the formation of the track width-setting layer 12a, the coupler portion 12b comprising a magnetic material is formed on the contact hole 9a and a connector layer 13 comprising a magnetic material is formed on the connector portion 10a. The coupler portion layer 12b forms a portion of the upper magnetic pole layer 12, which is to be magnetically connected to the upper shield layer 8.

Then, magnetic pole trimming is carried out. That is, in an area around the track width-setting layer 12a, the track width-setting layer 12a is used as a mask to etch at least a part of the recording gap layer 9 and the magnetic pole portion of the upper shield layer 8 on the recording gap layer 9 side, whereby, as shown in FIG. 5, there is a trim structure formed, in which at least a part of the magnetic pole portion of the upper magnetic pole layer 12, the recording gap layer 9 and the magnetic pole portion of the upper shield layer 8 has a uniform width. This trim structure makes sure prevention of an effective increase in the track width due to the spread of a magnetic flux near the recording gap layer 9.

Then, an insulating layer 14 comprising alumina or other inorganic insulating material is formed around the whole at a thickness of typically 3 to 4 μm.

Then, that insulating layer 14 is polished by chemo-mechanical polishing or the like as far as the surfaces of the track width-setting layer 12a, coupler portion layer 12b and connector layer 13 for flattening.

Then, the second layer portion 15 of the thin-film coil typically comprising copper (Cu) is formed on the flattened insulating layer 14 at a thickness of typically 2 to 3 μm. In FIG. 4, note that reference numeral 15a is indicative of a connector portion of the second layer portion 15, which is to be connected to the connector portion 10a of the first layer portion 10 of the thin-film coil by way of the connector layer 13. The second layer portion 15 is wound around the coupler portion layer 12b.

Then, an insulating layer 16 comprising a photo-resist or other organic material having fluidity upon heating is formed in such a given pattern as to cover the second layer portion 15 of the thin-film coil and the surrounding insulating layer 14.

Then, the insulating layer 16 is heat treated at a given temperature to make its surface flat. By this heat treatment, each of the edge portions of the outer and inner peripheries of the insulating layer 16 is configured into a rounded slant.

Then, the magnetic material for the recording head such as permalloy is used to form the yoke portion layer 12c forming the yoke portion of the upper magnetic layer 12 on the track width-setting layer 12a, insulating layers 14, 16 and coupler portion layer 12b. An end of the yoke layer portion 12c on the medium opposite plane 20 side is spaced away from the medium opposite plane 20, and the yoke portion layer 12c is connected to the lower magnetic pole layer 19 by way of the coupler portion layer 12b.

Then, an overcoat layer 17 typically comprising alumina is formed in such a way as to cover the whole. Finally, a slider including the aforesaid respective layers is machined to form the medium opposite plane 20 of the thin-film head including the recording head and reproducing head in the form of a complete thin-film magnetic head.

The thus fabricated thin-film magnetic head comprises the medium opposite plane 20 in opposition to the recording medium, the aforesaid reproducing head and the recording head (induction type of magnetic device).

The magnetic head comprises the magnetic lower and upper magnetic pole layers 19 and 12 that include mutually opposite magnetic pole portions on the medium opposite plane 20 side and are magnetically coupled to each other, the recording gap layer 9 located between the magnetic pole portion of the lower magnetic pole layer 19 and the magnetic pole portion of the upper magnetic pole layer 12, and the thin films 10, 15 at least a part of which is located between the lower 19 and the upper magnetic pole layer 12 while insulated from them.

As shown in FIG. 4, such a thin-film magnetic head has a throat height (indicated by TH in the drawing) that is defined by a length from the medium opposite plane 20 up to the end of the insulating layer 11 on the medium opposite plane side. In other words, the "throat height" means a length (height) from the medium opposite plane 20 to a position at which the two magnetic pole layers start being spaced away.

(Explanation of how the Thin-Film Magnetic Head Works)

How the thin-film magnetic head according to the embodiment here works is now explained. The thin-film magnetic head records information in the recording medium by the recording head, and plays back the information recorded in the recording medium by the reproducing head.

At the reproducing head, the direction of a bias magnetic field applied by the bias magnetic field-applying layers 6 is orthogonal to a direction perpendicular to the medium opposite plane 20. At the CPP-GMR device 5 with no signal magnetic field applied yet, the magnetization direction of the free layer 50 lies in the direction of the bias magnetic field, and the magnetization direction of the fixed magnetization layer 30 is fixed in a direction perpendicular to the medium opposite plane 20.

At the CPP-GMR device assembly 5, there is a change in the magnetization direction of the free layer 50 depending on a signal magnetic field from the recording medium, which in turn causes a change in the relative angle between the magnetization direction of the free layer 50 and the magnetization direction of the fixed magnetization layer 30, with the result that there is a change in the resistance value of the CPP-GMR device assembly 5. The resistance value of the CPP-GMR device assembly 5 may be found from a potential difference between the first and second shield layers, i.e., the two electrode layers 3 and 8 at the time when a sense current is passed through the MR device. It is thus possible for the reproducing head to play back the information recorded in the recording medium.

(Explanation of the Head Gimbal Assembly and the Magnetic Disk System)

The head gimbal assembly and the magnetic disk system according to the embodiment here are now explained.

A slider 210 included in the head gimbal assembly is first explained with reference to FIG. 6. In the magnetic disk system, the slider 210 is located in such a way as to face a hard disk that is a rotationally driven disk-form recording medium. This slider 210 primarily comprises a substrate 211 built up of a substrate 1 and an overcoat 17 depicted in FIG. 2.

The substrate 211 is in a generally hexahedral shape. Of the six surfaces of the substrate 211, one surface is in opposition to the hard disk. On that one surface there is a medium opposite plane 20 formed.

As the hard disk rotates in the z-direction in FIG. 6, it causes an air flow passing between the hard disk and the slider 210 to induce lift in the downward y-direction in FIG. 6. This lift in turn causes the slider 210 to levitate over the surface of the hard disk. Note here that the x-direction in FIG. 6 traverses tracks on the hard disk.

Near the end of the slider 210 on an air exit side (the left lower end in FIG. 6), there is the thin-film magnetic head 100 formed according to the embodiment here.

A head gimbal assembly 220 according to this embodiment is now explained with reference to FIG. 7. The head gimbal assembly 220 comprises a slider 210 and a suspension 221 adapted to resiliently support that slider 210. The suspension 221 comprises a leaf spring-form load beam 222 formed typically of stainless steel, a flexure 223 attached to one end of the load beam 222 and having the slider 210 joined to it for giving a suitable degree of flexibility to the slider 210, and a base plate 224 attached to the other end of the load beam 222.

The base plate 224 is adapted to be attached to an arm 230 of an actuator for moving the slider 210 in the track traverse direction x of the hard disk 262. The actuator comprises the arm 230 and a voice coil motor for driving that arm 230. At a portion of the flexure 223 having the slider 210 attached to it, there is a gimbal portion provided for keeping the posture of the slider 210 constant.

The head gimbal assembly 220 is attached to the arm 230 of the actuator. The head gimbal assembly 220 attached to one arm 230 is called a head arm assembly, whereas the head gimbal assembly 220 attached to a carriage at its plurality of arms is referred to as a head stack assembly.

FIG. 7 illustrates one example of the head arm assembly, wherein the head gimbal assembly 220 is attached to one end of the arm 230. To the other end of the arm 230, a coil 231 forming a part of the voice coil motor is attached. Halfway across the arm 230, there is a bearing portion 233 attached to a shaft 234 adapted to support the arm 230 in a pivotal fashion.

One example of the head stack assembly and the magnetic disk system according to the instant embodiment are now explained with reference to FIGS. 8 and 9.

FIG. 8 is illustrative of part of the magnetic disk system, and FIG. 7 is a plan view of the magnetic disk system.

A head stack assembly 250 comprises a carriage 251 having a plurality of arms 252. The plurality of arms 252 are provided with a plurality of the head gimbal assemblies 220 such that they line up vertically at an interval. On the side of the carriage 251 that faces away from the arms 252, there is a coil 253 attached, which coil becomes a part of the voice coil motor. The head stack assembly 250 is incorporated in the magnetic disk system.

The magnetic disk system comprises a plurality of hard disks 262 attached to a spindle motor 261. For each hard disk 262, two sliders 210 are located such that they are opposite to each other with the hard disk 262 held between them. The voice coil motor has also permanent magnets 263 located at opposite positions with the coil 253 of the head stack assembly 250 held between them.

The head stack assembly 250 except the slider 210 and the actuator correspond to the positioning device here which is operable to support the slider 210 and position it relative to the hard disk 262.

With the magnetic disk system here, the actuator is actuated to move the slider 210 in the track traverse direction of the hard disk 262, thereby positioning the slider 210 with respect to the hard disk 262. The thin-film magnetic head incorporated in the slider 210 works such that information is recorded by a recording head in the hard disk 262, and the information recorded in the hard disk 262 is played back by a reproducing head.

The head gimbal assembly and the magnetic disk system here have pretty much the same action as the thin-film magnetic head according to the foregoing embodiment.

While the embodiment here has been described with reference to the thin-film magnetic head of the structure wherein the reproducing head is located on the substrate side and the recording head is stacked on the reproducing head, it is contemplated that that order of stacking could be reversed. When the thin-film magnetic head here is used as a read-only head, the recording head could be removed from it.

It is also contemplated that part of the invention may be applied not only to magnetic heads but also as a so-called thin-film magnetic field sensor adapted to detect a magnetic field.

Explanation of the Specific Experimental Examples

The CPP-GMR device as described above is now explained in more details with reference to the following specific experimental examples.

Experimental Example I-1

A multilayer device assembly (GMR device assembly) comprising such a multilayer structure as set out in Table 1 was formed by sputtering into an experimental sample.

TABLE 1

| Multilayer Structure | | Materials of the Layers | Thickness (nm) |
|---|---|---|---|
| Cap Layer | | Ru | 10.0 |
| Free Layer | | CoFe | 4.0 |
| Spacer Layer | | Cu | 2.5 |
| Fixed Magnetization Layer | Inner Layer | CoFe | 3.5 |
| | Non-Magnetic Intermediate Layer | Ru | 0.8 |
| | Outer Layer | CoFe | 3.0 |
| Antiferromagnetic Layer | | IrMn | 6.0 |
| Underlay Layer | | Ru | 2.0 |
| | | Ta | 1.0 |

The aforesaid multilayer device assembly was found to have an area resistivity, AR, of $0.07 \Omega \mu m^2$ as measured by a dc 4-terminal method The thickness of the refilled insulation layer shown in Table 3 was varied to vary the position of point P, thereby preparing samples wherein the position of point P was:

T2/T1=0,
T2/T1=0.2,
T2/T1=0.4,
T2/T1=0.6,
T2/T1=0.9,
T2/T1=1.0, and
T2/T1=1.2.

Note here that the samples were prepared using an IBD (ion beam deposition) system. The angle of deposition was set at 40 degrees with respect to zero degree at which the target was opposite to, and parallel with, the substrate. Preliminary experimentation has shown that by use of the IBD system, the adjustment of the position of point P of the refilled insulation layer 7 of FIG. 3 can be made by the thickness of the refilled insulation layer 7 alone.

For each of the obtained samples, (1) the MR ratio and (2) the resistance to magnetic field were estimated in the form of the averages of 160 samples as follows.

(1) MR Ratio (MR Change Ratio)

A wafer with a plurality of devices formed on it was polished into a bar state. In this bar state, the MR ratios figured out of HF-QST (high field-quasistatic test) were estimated. The estimation was done at a BHV (bias head voltage)=25 mV and an external magnetic field H=−5 kOe to +5 kOe, and the MR ratio was defined by $[(MR_{Rmax}-MR_{Rmin})/MR_{Rmin}] \times 100$.

(2) Resistance to Magnetic Field

This is a method for the estimation of the stability of an output with respect to a stress magnetic field in the transverse direction (of the magnetic field entering the device from the ABS).

[Test Method]

The test was carried out according to the following steps 1 to 5.

(Step 1): The hard magnet layer (bias magnetic field-applying layers 6) was magnetized in an external magnetic field H=8 kOe (in the track width direction).

(Step 2): The output of Bar-QST was measured in an external magnetic field H=−6,000 Oe to +6,000 Oe (in the ABS direction).

(Step 3): As the stress magnetic field, 1,500 Oe were applied in such a direction as to enter the device from the ABS.

(Step 4): The output of Bar-QST was measured in an external magnetic filed H=−6,000 Oe to +6,000 Oe (in the ABS direction).

(Step 5): Devices with output fluctuations exceeding ±10% at Steps 2 and 4 were rejected as NG ones. NG devices could be caused by magneto-static coupling occurring as the distance between the free layer draws and the shields decreases.

The results are set out in Table 2.

TABLE 2

(Ru cap; RA = $0.07 \Omega \cdot \mu m^2$)

| Sample No. | T2/T1 | MR Ratio (%) | Reject Rate (%) |
|---|---|---|---|
| I-1-1* (Comp. Ex.) | 0 | 3.8 | 1.5 |
| I-1-2 (Ex.) | 0.2 | 5.6 | 1.5 |
| I-1-3 (Ex.) | 0.4 | 6.6 | 0.5 |
| I-1-4 (Ex.) | 0.6 | 6.8 | 1.0 |
| I-1-5 (Ex.) | 0.9 | 7.0 | 0.5 |
| I-1-6* (Comp. Ex.) | 1.0 | 5.0 | 9.0 |
| I-1-7 (Comp. Ex.) | 1.2 | 1.4 | 38.2 |

Experimental Example I-2

In the arrangement of the multilayer device assembly used in Experimental Example I-1, the cap layer was changed from Ru to Ta (tantalum). Otherwise, the samples of Experimental Example I-2 were prepared and estimated in the same manner as in Experimental Example I-1.

Note here that the area resistivity (AR) of the multilayer device assembly (MR device assembly) was $0.08 \Omega \cdot \mu m^2$. The results are set out in Table 3.

TABLE 3

(Ta cap; RA = $0.08 \Omega \cdot \mu m^2$)

| Sample No. | T2/T1 | MR Ratio (%) | Reject Rate (%) |
|---|---|---|---|
| I-2-1* (Comp. Ex) | 0 | 2.8 | 0.5 |
| I-2-2 (Ex.) | 0.2 | 5.0 | 1.5 |
| I-2-3 (Ex.) | 0.4 | 6.2 | 0.5 |
| I-2-4 (Ex.) | 0.6 | 6.4 | 1.5 |
| I-2-5 (Ex.) | 0.9 | 7.1 | 1.0 |
| I-2-6* (Comp. Ex.) | 1.0 | 4.7 | 11.3 |
| I-2-7* (Comp. Ex.) | 1.2 | 0.9 | 43.3 |

Experimental Example I-3

In the arrangement of the multilayer device assembly used in Experimental Example I-1, the cap layer was changed from Ru to Ti (titanium). Otherwise, the samples of Experimental Example I-3 were prepared and estimated in the same manner as in Experimental Example I-1.

Note here that the area resistivity (AR) of the multilayer device assembly was 0.07Ωµm2.

The results are set out in Table 4.

TABLE 4

(Ti cap; RA = 0.07 Ω · µm²)

| Sample No. | T2/T1 | MR Ratio (%) | Reject Rate (%) |
|---|---|---|---|
| I-3-1* (Comp. Ex.) | 0 | 3.4 | 2.0 |
| I-3-2 (Ex.) | 0.2 | 5.3 | 1.0 |
| I-3-3 (Ex.) | 0.4 | 6.2 | 2.5 |
| I-3-4 (Ex.) | 0.6 | 6.4 | 0.5 |
| I-3-5 (Ex.) | 0.9 | 6.9 | 0.5 |
| I-3-6* (Comp. Ex.) | 1.0 | 4.9 | 14.2 |
| I-3-7* (Comp. Ex.) | 1.2 | 1.0 | 33.7 |

Experimental Example II-1

The area resistivity (AR) of the multilayer device assembly (MR device assembly) used in Experimental Example I-1 was changed from 0.07Ωµm² to 0.15Ωµm².

To vary the area resistivity AR, the structure of the multilayer device assembly was changed as set out in Table 5 given below. In particular, the arrangement and fabrication process of the spacer layer were changed.

TABLE 5

| Multilayer Structure | | Materials of the Layers | Thickness (nm) |
|---|---|---|---|
| Cap Layer | | Ru | 10.0 |
| Free Layer | | CoFe | 4.0 |
| Spacer Layer | Deposited Layer | Al | 0.5 |
| | Electroconductive Layer | Cu | 2.0 |
| Fixed Magnetization Layer | Inner Layer | CoFe | 3.5 |
| | Nonmagnetic Intermediate Layer | Ru | 0.8 |
| | Outer Layer | CoFe | 3.0 |
| Antiferromagnetic Layer | | IrMn | 6.0 |
| Underlay Layer | | Ru | 2.0 |
| | | Ta | 1.0 |

The following arrangement of the spacer layer given below was prepared by the following preparation process.

(1) The Cu layer of 2 nm in thickness was formed as an electroconductive layer (lower electro-conductive layer) on the inner layer composed of CoFe.

(2) Then, the deposition layer composed of aluminum was stacked on this Cu layer. The deposition layer had a thickness of 0.5 nm. The deposition layer thickness of 0.5 nm was a thickness by mass found from a deposition rate. Indeed, the deposition layer is not a perfect continuous film; it takes on a so-called archipelagic form where islands composed of a material forming the deposition layer look just as spotted. In the electroconductive layer (lower electroconductive layer) composed of the Cu layer, therefore, a portion partly covered with the deposition layer composed of aluminum coexists with a portion having the Cu layer exposed directly to view.

(3) Then, a part of the deposition layer composed of aluminum was oxidized. This oxidization may be carried out by exposure to oxygen or plasma oxidization. However, plasma oxidization was here used.

Of the thus prepared samples of Experimental Example II-1, much the same estimation as in Experimental Example I-1 was performed.

The results are set out in Table 6.

TABLE 6

(Ru cap; RA = 0.15 Ω · µm²)

| Sample No. | T2/T1 | MR Ratio (%) | Reject Rate (%) |
|---|---|---|---|
| II-1-1* (Comp. Ex.) | 0 | 4.7 | 1.0 |
| II-1-2 (Ex.) | 0.2 | 6.0 | 0.5 |
| II-1-3 (Ex.) | 0.4 | 6.9 | 1.5 |
| II-1-4 (Ex.) | 0.6 | 7.2 | 0.5 |
| II-1-5 (Ex.) | 0.9 | 7.5 | 1.0 |
| II-1-6* (Comp. Ex.) | 1.0 | 6.1 | 18.1 |
| II-1-7* (Comp. Ex.) | 1.2 | 1.3 | 46.6 |

Experimental Example II-2

In the arrangement of the multilayer device assembly used in Experimental Example II-1, the cap layer was changed from Ru to Ta (tantalum). Otherwise, the samples of Experimental Example II-2 were prepared and estimated in the same manner as in Experimental Example II-1.

Note here that the area resistivity (AR) of the multilayer device assembly (MR device assembly) was set at 0.15Ωµm² by adjusting the oxidization process conditions for the spacer layer.

The results are set out in Table 7.

TABLE 7

(Ta cap; RA = 0.15 Ω · µm²)

| Sample No. | T2/T1 | MR Ratio (%) | Reject Rate (%) |
|---|---|---|---|
| II-2-1* (Comp. Ex.) | 0 | 4.1 | 1.5 |
| II-2-2 (Ex.) | 0.2 | 5.3 | 1.5 |
| II-2-3 (Ex.) | 0.4 | 6.7 | 0.5 |
| II-2-4 (Ex.) | 0.6 | 7.2 | 0.5 |
| II-2-5 (Ex.) | 0.9 | 7.4 | 1.0 |
| II-2-6* (Comp. Ex.) | 1.0 | 5.1 | 16.2 |

TABLE 7-continued (Ta cap; RA = 0.15 Ω · μm²)

| Sample No. | T2/T1 | MR Ratio (%) | Reject Rate (%) |
|---|---|---|---|
| II-2-7* (Comp. Ex.) | 1.2 | 1.2 | 32.4 |

Experimental Example II-3

In the arrangement of the multilayer device assembly used in Experimental Example II-1, the cap layer was changed from Ru to Ti (titanium). Otherwise, the samples of Experimental Example II-3 were prepared and estimated in the same manner as in Experimental Example II-1.

Note here that the area resistivity (AR) of the multilayer device assembly (MR device assembly) was set at 0.15Ωμm² by adjusting the oxidization process conditions for the spacer layer.

The results are set out in Table 8.

TABLE 8

(Ti cap; RA = 0.15 Ω · μm²)

| Sample No. | T2/T1 | MR Ratio (%) | Reject Rate (%) |
|---|---|---|---|
| II-3-1* (Comp. Ex.) | 0 | 4.4 | 0.5 |
| II-3-2 (Ex.) | 0.2 | 5.4 | 0.5 |
| II-3-3 (Ex.) | 0.4 | 6.6 | 1.0 |
| II-3-4 (Ex.) | 0.6 | 7.1 | 1.5 |
| II-3-5 (Ex.) | 0.9 | 7.4 | 0.5 |
| II-3-6* (Comp. Ex.) | 1.0 | 4.9 | 17.1 |
| II-3-7* (Comp. Ex.) | 1.2 | 2.9 | 35.8 |

Experimental Example III-1

The area resistivity (AR) of the multilayer device assembly (MR device assembly) used in Experimental Example II-1 was changed from 0.15Ωμm² to 0.25Ωμm² by adjusting the oxidization process conditions for the spacer layer. Otherwise, the samples of Experimental Example III-1 were prepared and estimated in the same manner as in Experimental Example II-1.

The results are set out in Table 9.

TABLE 9

(Ru cap; RA = 0.25 Ω · μm²)

| Sample No. | T2/T1 | MR Ratio (%) | Reject Rate (%) |
|---|---|---|---|
| III-1-1* (Comp. Ex.) | 0 | 5.2 | 0.5 |
| III-1-2 (Ex.) | 0.2 | 6.5 | 2.0 |
| III-1-3 (Ex.) | 0.4 | 7.1 | 1.5 |
| III-1-4 (Ex.) | 0.6 | 7.4 | 1.5 |
| III-1-5 (Ex.) | 0.9 | 7.6 | 1.0 |
| III-1-6* (Comp. Ex.) | 1.0 | 5.6 | 14.5 |
| III-1-7* (Comp. Ex.) | 1.2 | 1.1 | 49.2 |

Experimental Example III-2

In the arrangement of the multilayer device assembly used in Experimental Example III-1, the cap layer was changed from Ru to Ta (tantalum). Otherwise, the samples of Experimental Example III-2 were prepared and estimated in the same manner as in Experimental Example III-1.

Note here that the area resistivity (AR) of the multilayer device assembly (MR device assembly) was set at 0.25Ωμm² by adjusting the oxidization process conditions for the spacer layer.

The results are set out in Table 10.

TABLE 10

(Ta cap; RA = 0.25 Ω · μm²)

| Sample No. | T2/T1 | MR Ratio (%) | Reject Rate (%) |
|---|---|---|---|
| III-2-1* (Comp. Ex.) | 0 | 5.0 | 2.0 |
| III-2-2 (Ex.) | 0.2 | 6.6 | 1.5 |
| III-2-3 (Ex.) | 0.4 | 7.3 | 1.0 |
| III-2-4 (Ex.) | 0.6 | 7.6 | 0.5 |
| III-2-5 (Ex.) | 0.9 | 7.4 | 1.5 |
| III-2-6* (Comp. Ex.) | 1.0 | 4.8 | 11.2 |
| III-2-7* (Comp. Ex.) | 1.2 | 1.4 | 44.9 |

Experimental Example III-3

In the arrangement of the multilayer device assembly used in Experimental Example III-1, the cap layer was changed from Ru to Ti (titanium). Otherwise, the samples of Experimental Example III-3 were prepared and estimated in the same manner as in Experimental Example III-1.

Note here that the area resistivity (AR) of the multilayer device assembly (MR device assembly) was set at 0.25Ωμm² by adjusting the oxidization process conditions for the spacer layer.

The results are set out in Table 11.

TABLE 11

(Ti cap; RA = 0.25 Ω·μm²)

| Sample No. | T2/T1 | MR Ratio (%) | Reject Rate (%) |
|---|---|---|---|
| III-3-1* (Comp. Ex.) | 0 | 5.1 | 1.0 |
| III-3-2 (Ex.) | 0.2 | 6.5 | 1.0 |
| III-3-3 (Ex.) | 0.4 | 7.5 | 1.5 |
| III-3-4 (Ex.) | 0.6 | 7.4 | 0.5 |
| III-3-5 (Ex.) | 0.9 | 7.7 | 0.5 |
| III-3-6* (Comp. Ex.) | 1.0 | 4.2 | 10.0 |
| III-3-7* (Comp. Ex.) | 1.2 | 1.2 | 39.9 |

From the aforesaid results of experimentation, the advantages of the invention would be evident. That is, the present invention provides a giant magneto-resistive effect device (CPP-GMR device) having a CPP (current perpendicular to plane) structure comprising a multilayer device assembly comprising a fixed magnetization layer, a spacer layer, a free layer and a cap layer stacked one upon another in order, with a sense current applied in a stacking direction of said multilayer device assembly, wherein, in the rear of said multilayer device assembly, there is a refilled insulation layer formed, which is in contact with the rear end face of said multilayer device assembly and extends rearward, wherein the uppermost position P of said refilled insulation layer that is in contact with the rear end face of said multilayer device assembly lies at a position in contact with the rear end face of the cap layer and is set in such a way as to satisfy a relation: $0.2 \leq (T2/T1) < 1$ where T1 is the thickness of the cap layer, and T2 is the absolute value of a distance from the uppermost portion of the cap layer down to the position P as viewed in a thickness direction. Thus, the invention can provide a CPP-GMR device with which further improvements in the MR change ratio at an area of low area resistivity AR are brought about and resistance to magnetic field is enhanced with high reliability as well, so that the coming-generation heads having such a recording density as exceeds 400 Gbpsi could be practically achieved.

Referring to possible applications of the invention to the industry, it could be utilized in the industry of magnetic disk systems comprising a magneto-resistive effect device for reading the magnetic fields of magnetic recording media or the like as signals.

What we claim is:

1. A magneto-resistive effect device having a CPP (current perpendicular to plane) structure comprising a multilayer device assembly comprising a first ferromagnetic layer, a spacer layer, a second ferromagnetic layer and a cap layer stacked one upon another in order, with a sense current applied in a stacking direction of said multilayer device assembly, characterized in that
in the rear of said multilayer device assembly, there is a refilled insulation layer formed, which is in contact with a rear end face of said multilayer device assembly and extends rearward, wherein:
the uppermost position P of said refilled insulation layer that is in contact with the rear end face of said multilayer device assembly lies at a rear end face of the cap layer and is set in such a way as to satisfy a relation: $0.2 \leq (T2/T1) < 1$ where T1 is a thickness of the cap layer, and T2 is the absolute value of a distance from the uppermost portion of the cap layer down to the position P as viewed in a thickness direction.

2. The magneto-resistive effect device according to claim 1, wherein the uppermost position P of said refilled insulation layer that is in contact with the rear end face of said multilayer device assembly is set in such a way as to satisfy a relation: $0.2 \leq (T2/T1) \leq 0.9$.

3. The magneto-resistive effect device according to claim 1, wherein the uppermost position P of said refilled insulation layer that is in contact with the rear end face of said multilayer device assembly is set in such a way as to satisfy a relation: $0.4 \leq (T2/T1) \leq 0.9$.

4. The magneto-resistive effect device according to claim 1, wherein said cap layer is made of at least one selected from the group consisting of Ta, Ru, Ti, W, Cr, Rh, and NiCr.

5. The magneto-resistive effect device according to claim 1, wherein said multilayer device assembly has an area resistivity of 0.05 to $0.3 \Omega \mu m^2$.

6. The magneto-resistive effect device according to claim 1, wherein said second ferromagnetic layer is a free layer which functions such that a magnetization direction changes depending on an external magnetic field, and said first ferromagnetic later is a fixed magnetization layer which has a magnetization direction fixed.

7. A thin-film magnetic head, characterized by comprising:
a medium opposite plane opposite to a recoding medium,
a magneto-resistive effect device as recited in claim 1, which is located near said medium opposite plane for detecting a signal magnetic field from said recording medium, and
a pair of electrodes for passing a current in the stacking direction of said magneto-resistive effect device.

8. A head gimbal assembly, characterized by comprising:
a slider including a thin-film magnetic head as recited in claim 7 and located in opposition to a recording medium, and
a suspension adapted to resiliently support said slider.

9. A magnetic disk system, characterized by comprising:
a slider including a thin-film magnetic head as recited in claim 7 and located in opposition to a recording medium, and
a positioning means adapted to support and position said slider with respect to said recording medium.

* * * * *